United States Patent
Tang et al.

(10) Patent No.: US 6,405,594 B1
(45) Date of Patent: Jun. 18, 2002

(54) SILICON BASE PLATE WITH LOW PARASITIC ELECTRICAL INTERFERENCE FOR SENSORS

(75) Inventors: Tony K. Tang, Glendale; Roman C. Gutierrez, La Crescenta, both of CA (US)

(73) Assignee: California Institute of Technology, Pasadena, CA (US)

( * ) Notice: Subject to any disclaimer, the term of this patent is extended or adjusted under 35 U.S.C. 154(b) by 62 days.

(21) Appl. No.: 09/612,327

(22) Filed: Jul. 6, 2000

Related U.S. Application Data

(60) Provisional application No. 60/143,200, filed on Jul. 9, 1999.

(51) Int. Cl.$^7$ .............................................. G01P 15/00
(52) U.S. Cl. ............................... 73/504.02; 73/514.35; 257/415
(58) Field of Search ..................... 73/514.35, 504.02, 73/504.03, 504.04, 504.12, 504.14, 514.29; 257/415

(56) References Cited

U.S. PATENT DOCUMENTS 5,216,490 A  *  6/1993  Greiff et al. ............. 73/514.35

* cited by examiner

Primary Examiner—Richard A. Moller
(74) Attorney, Agent, or Firm—Fish & Richardson P.C.

(57) ABSTRACT

A microgyroscope has a baseplate made of the same material as the rest of the microgyroscope. The baseplate is a silicon baseplate having a heavily p-doped epilayer covered by a thick dielectric film and metal electrodes. The metal electrodes are isolated from the ground plane by the dielectric. This provides very low parasitic capacitive coupling between the electrodes. The thick dielectric reduces the capacitance between the electrodes and the ground plane.

12 Claims, 2 Drawing Sheets

SILICON BASE PLATE WITH LOW PARASITIC ELECTRICAL INTERFERENCE FOR SENSORS

CROSS-REFERENCE TO RELATED APPLICATIONS

This application claims benefit of U.S. Provisional Application No. 60/143,200, filed Jul. 9, 1999.

ORIGIN OF INVENTION

The invention described herein was made in the performance of work under a NASA contract, and is subject to the provisions of Public Law 96-517 (35 U.S.C. § 202) in which the Contractor has elected to retain title.

TECHNICAL FIELD

This invention relates to vibratory gyroscopes, and more particularly to silicon micromachined vibratory gyroscopes.

BACKGROUND

Multi-axis sensors are highly desirable for inertial sensing of motion in three dimensions. Previously, such sensors were constructed of relatively large and expensive electromagnetic and optical devices. More recently, micromechanical sensors have been fabricated using semiconductor processing techniques. Microelectrical mechanical or "MEMS" systems allow formation of physical features using semiconductor materials and processing techniques. These techniques enable the physical features to have relatively small sizes and be precise. Specifically, micromechanical accelerometers and gyroscopes have been formed from silicon wafers by using photolithographic and etching techniques. Such microfabricated sensors hold the promise of large scale production and therefore low cost.

The integration of three gyroscopic sensors to measure the rotation rates about the three separate axes coupled with three accelerometric sensors to measure the acceleration along the three axes on a single chip would provide a monolithic, six degree-of-freedom inertial measurement system capable of measuring all possible translations and orientations of the chip. There has been some difficulty in constructing a high-performance, or sensitive vibratory rate gyroscope to measure the rotation about the axis normal to the plane of the silicon chip, i.e., the Z-axis.

In a vibratory gyroscope, the Coriolis effect induces energy transfer from the driver input vibratory mode to another mode which is sensed or output during rotation of the gyroscope. Silicon micromachined vibratory gyroscopes are integratable with silicon electronics. These devices are capable of achieving high Q factors, can withstand high g shocks due to their small masses, are insensitive to linear vibration and consume little power. However, most of these micromachined gyroscopes have a very small rotation response, since their input and output vibration modes have different mode shapes and resonant frequencies. The use of different resonant modes also makes these devices very temperature sensitive due to the different temperature dependency of each of the modes. These devices usually have very high resonant frequencies resulting in low responsivity, since the Coriolis induced response is inversely proportional to the resonant frequency of the structure. Finally, due to the small mass of the structure, thermal noise limits the ultimate performance and use of microgyroscopes. For these reasons, micromachined vibratory gyroscopes have not been used for precision navigation and attitude control applications, but have been employed primarily for automotive applications in which extreme low cost is a major driving factor and performance is set at a lower premium.

Traditional baseplates for the microgyroscopes were constructed using either quartz or ceramic. Although these materials were helpful in reducing parasitic capacitance, the thermal expansion coefficient for these materials is different than the rest of the microgyroscope. Thus, under a variety of temperatures, the stress on the microgyroscope varies. What is needed is a baseplate having a similar thermal expansion coefficient as the rest of the microgyroscope while reducing the effects of parasitic capacitance.

SUMMARY

The present invention is a microgyroscope having a baseplate made of the same material as the rest of the microgyroscope. The baseplate is a silicon baseplate having a heavily p-doped epilayer covered by a thick dielectric film and metal electrodes. The metal electrodes are isolated from the ground plane by the dielectric. This provides very low parasitic capacitive coupling between the electrodes. The thick dielectric reduces the capacitance between the electrodes and the ground plane.

DESCRIPTION OF DRAWINGS

These and other features and advantages of the invention will become more apparent upon reading the following detailed description and upon reference to the accompanying drawings.

DETAILED DESCRIPTION

Figure 1:
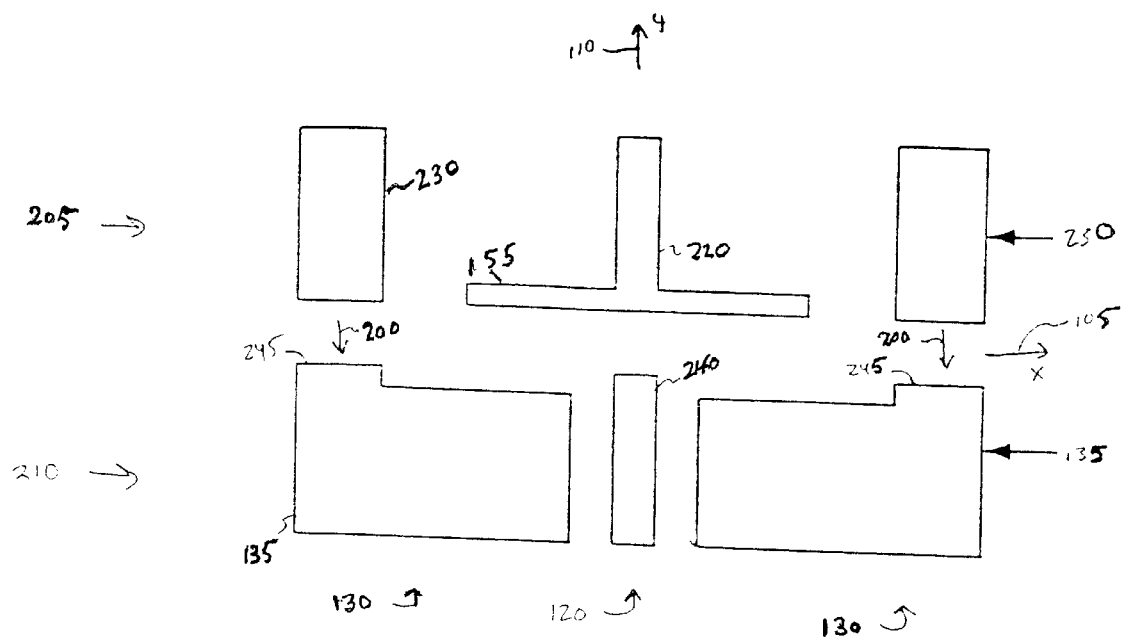
FIG. 1 is a side view of the components of a microgyroscope constructed according to one embodiment of the present invention.

FIG. 1 is a side view of a microgyroscope 100 constructed according to one embodiment of the present invention. The microgyroscope 100 detects forces in the x-direction 105, the y-direction 110, and in the z-direction 115. Vertical capacitors 130 surround the vertical post 120. The vertical capacitors 130 provide electrostatic actuation of the vertical post 120 and allow for capacitive detection of the motions of the vertical post 120.

A first section 205 of the microgyroscope 100 is made from a first silicon wafer and a second section 210 of the microgyroscope is made from a second silicon wafer. The first section 205 of the microgyroscope 100 includes a first portion 220 of the vertical post 120 and first portions 230 of the vertical capacitors 130. The second section 210 of the microgyroscope 100 includes a second portion 240 of the vertical post 120, second portions 245 of the vertical capacitors 130, and a baseplate 135. Although the invention is described with the vertical capacitors 130 being constructed of first portions 230 and second portions 245, it can be appreciated that the first portions 230 and second portions 245 may be electrically isolated to create even more independent vertical capacitors 130.

To construct the microgyroscope 100, the first section 205 is positioned above the section 210. The first section 205 is lowered as indicated by reference numeral 200 onto the second section 210. The first and second sections 205, 210 are then bonded together using standard bonding techniques such as metal-to-metal bonding. The first and second sections 205, 210 are bonded in a position so that the first portion 220 and the second portion 240 of the vertical post 120 are aligned to form one continuous vertical post 120. The first portions 230 of the vertical capacitors 130 are aligned with the second portions 245 of the vertical capacitors 130 on the baseplate 135. Of course, the first portions 235 and the second portions 230 may be electrically isolated. Thus, once the first section 205 is connected to the second section 210, the vertical post 120 is positioned with the microgyroscope 100.

Figure 2:
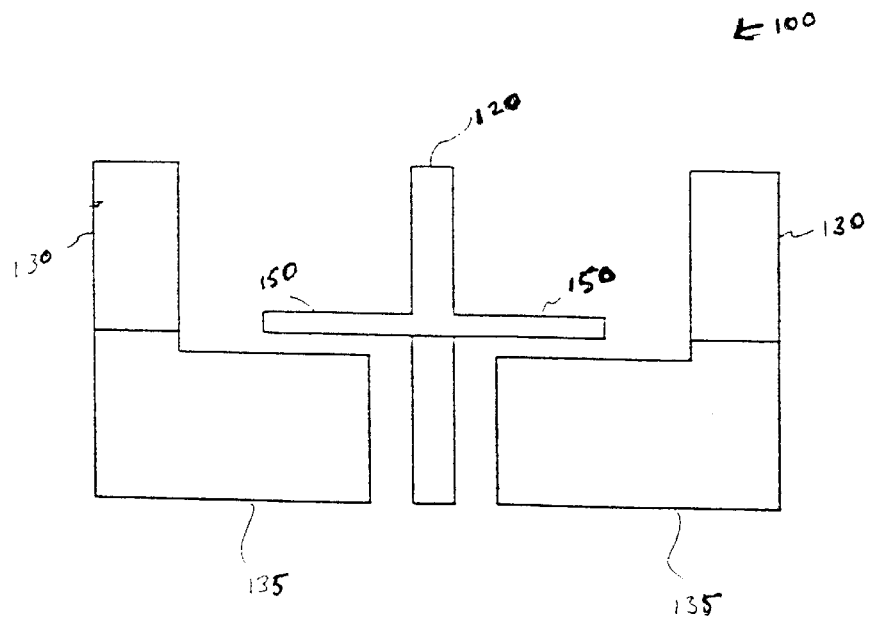
FIG. 2 is a side view of a bonded microgyroscope according to one embodiment of the present invention.

FIG. 2 shows a side view of the completed microgyroscope 100 according to one embodiment of the present invention. Once constructed, the vertical post 120 is supported by a series of flanges 150. The flanges 150 allow the vertical post 120 to rest upon the baseplate. As can be seen in FIG. 2, the flanges 150 are positioned at approximately the mid-point of the vertical post 120. Because the vertical post 120 is connected to the baseplate 135 via the flanges 150 at approximately the mid-point, the vertical post 120 is free to move in a rocking motion in the x-direction 105 and the y-direction 110. Under input rotation, the Coriolis force causes the vertical post 120 to move in the orthogonal direction to the drive motor. The rotation rate sensitivity is proportional to the input rotation rate, the drive amplitude, and the quality factor of the resonator.

Because each portion of the microgyroscope 100 is constructed from a silicon wafer, the performance variations from device to device is reduced. Further, the behavior of each portion of the microgyroscope 100 under varying temperature conditions is more consistent.

Figure 3:
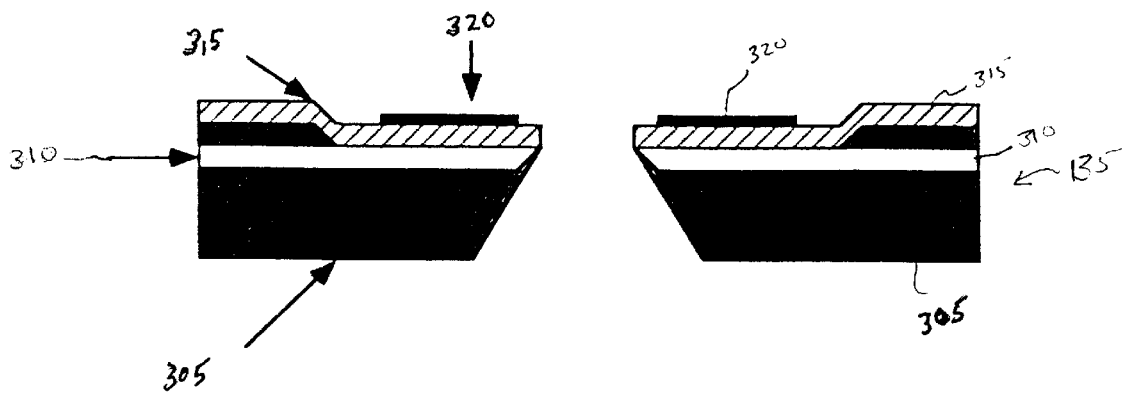
FIG. 3 is a side view of the baseplate of the microgyroscope according to one embodiment of the present invention.

FIG. 3 is a side view of the baseplate 135 of the microgyroscope 100 according to one embodiment of the present invention. The baseplate 135 comprises a silicon substrate 305, a silicon p+ epilayer 310, a dielectric layer 315, and metal electrodes 320. The silicon substrate 305 is grounded and covered by the heavily p-doped epilayer 310. The epilayer 310 is covered by the thick dielectric layer 315. The metal electrodes 320 are formed on the dielectric layer 315.

The dielectric layer 315 may be composed of silicon dioxide, silicon nitride, or other known dielectric materials. The dielectric layer 315 provides isolation of the metal electrodes 320 from the ground plane. The dielectric layer 315 is generally about 3 to 4 microns thick, and may be thicker than 4 microns to enhance the isolation. Because of the isolation provided by the dielectric layer, there is very little capacitive coupling between the metal electrodes 320.

Figure 4:
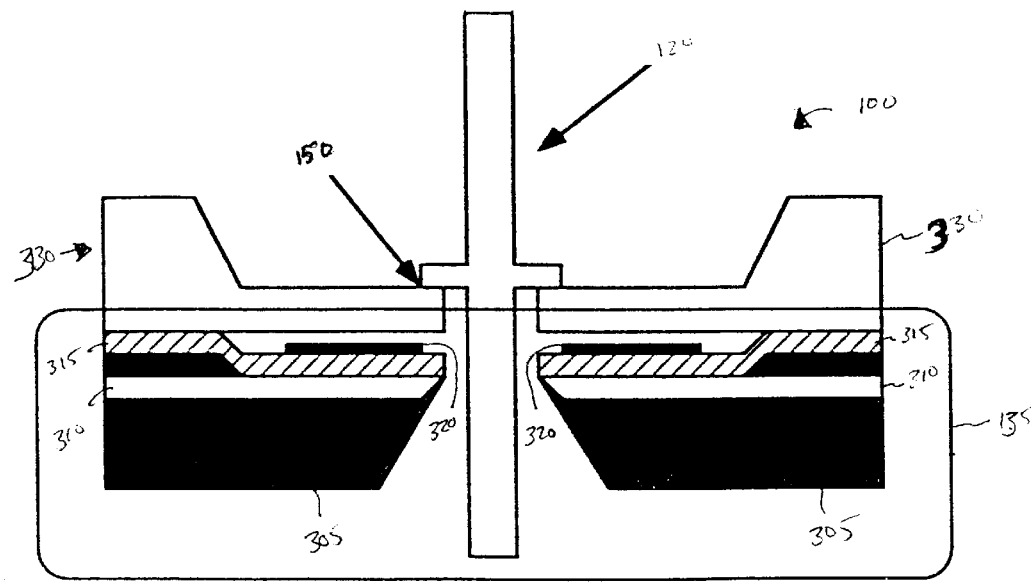
FIG. 4 is a side view of the microgyroscope including the baseplate of FIG. 3 according to one embodiment of the present invention.

FIG. 4 is a side view of the microgyroscope 100 including the baseplate 135 of FIG. 3 according to one embodiment of the present invention. In the fully assembled gyroscope 100, the vertical post 120 rests on a clover-leaf structure 330. The metal electrodes 320 provide electrostatic drive and sense control. The metal electrodes 320 are electrically isolated from each other and other electrical interference by the dielectric layer 315 and the substrate 305.

Numerous variations and modifications of the invention will become readily apparent to those skilled in the art. Accordingly, the invention may be embodied in other specific forms without departing from its spirit or essential characteristics.

What is claimed is:

1. A method of forming a baseplate for a microgyroscope comprising:

forming a substrate layer;

covering the substrate layer with a epilayer;

positioning a dielectric layer on the epilayer; and isolating a plurality of metal electrodes from the substrate layer.

2. The method of claim 1, wherein the metal electrodes are isolated by the dielectric layer, thereby reducing parasitic capacitance.

3. The method of claim 1, wherein the dielectric layer is approximately 3 to 4 microns thick.

4. The method of claim 1, wherein the dielectric layer is greater than 4 microns thick.

5. The method of claim 1, wherein the epilayer is a heavily p-doped epilayer.

6. The method of claim 1, wherein the baseplate is formed of silicon.

7. A microgyroscope comprising:

a substrate;

an epilayer which covers the substrate;

a dielectric layer formed over the epilayer; and a plurality of metal electrodes formed on the dielectric layer, wherein the dielectric layer isolates the plurality of metal electrodes from the substrate.

8. The microgyroscope of claim 7, wherein the substrate is grounded.

9. The microgyroscope of claim 7, wherein the epilayer is p-doped.

10. The microgyroscope of claim 7, wherein the dielectric layer is approximately 3–4 microns thick.

11. The microgyroscope of claim 7, wherein the dielectric layer is thicker than 4 microns.

12. The microgyroscope of claim 7, wherein the dielectric layer reduces parasitic capacitance between the metal electrodes.

* * * * *